United States Patent
Fredriksson (10) Patent No.: US 6,836,154 B2
(45) Date of Patent: Dec. 28, 2004

(54) DIRECTION SENSITIVE AND PHASE-INVERSION FREE PHASE DETECTORS

(75) Inventor: Jesper Fredriksson, Uppsala (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/362,237

(22) PCT Filed: Jun. 15, 2001

(86) PCT No.: PCT/SE01/01357

§ 371 (c)(1),
(2), (4) Date: Feb. 21, 2003

(87) PCT Pub. No.: WO02/19527

PCT Pub. Date: Mar. 7, 2002

(65) Prior Publication Data

US 2003/0155947 A1 Aug. 21, 2003

(30) Foreign Application Priority Data

Aug. 30, 2000 (SE) .............................. 0003058

(51) Int. Cl.⁷ .............................................. H03D 13/00
(52) U.S. Cl. ............................................ 327/3; 327/12
(58) Field of Search ........................................ 327/2–12

(56) References Cited

U.S. PATENT DOCUMENTS

| 4,951,005 A | * 8/1990 | Babin ........................ 331/16 |
| 5,132,642 A | 7/1992 | Bush et al. |
| 5,191,239 A | 3/1993 | Rogers ........................ 326/110 |
| 5,592,110 A | 1/1997 | Noguchi |
| 5,691,656 A | 11/1997 | Sandusky ........................ 327/7 |
| 5,920,207 A | 7/1999 | Suresh ........................ 327/3 |
| 5,963,058 A | 10/1999 | Thomas ........................ 327/3 |

FOREIGN PATENT DOCUMENTS

| GB | 2 161 660 | 1/1986 |
| GB | 2 161 660 A | 1/1986 |
| JP | 61-33021 | 2/1986 |
| JP | 9-307433 | 11/1997 |

OTHER PUBLICATIONS

Frequency Synthesis by Phase Lock, William Egan, 2$^{nd}$ Edition, pp. 198–199.
Phase Frequency Detectors (PFD), Technical Brief, SWRA029, Fractional/Integer–N PLL Basics, pp. 11–12.

\* cited by examiner

Primary Examiner—Timothy P. Callahan
Assistant Examiner—Cassandra Cox
(74) Attorney, Agent, or Firm—Nixon & Vanderhye P.C.

(57) ABSTRACT

The invention relates to a new phase detector state machine having a reset state that is released only when both phase detector input signals (R, V) have a common predetermined signal state. In this way, phase inversion is effectively prevented. The complementary phase error is properly masked and the phase detector range is reduced to the interval—$180° < \theta_e < 180°$, while still maintaining the direction sensitivity. Phase errors $\theta_e$ larger than half a period are automatically discarded. Consequently, if the phase detector ends up in a state, for example due to reference clock loss, in which the phase error is larger than half a period, the phase detector will be shifted back to normal operation with a phase error less than half a period during the next consecutive phase comparison period. Naturally, this saves valuable time in the lock-acquisition procedure.

11 Claims, 9 Drawing Sheets

NEXT STATE $q_V^+$    NEXT STATE $q_R^+$

DIRECTION SENSITIVE AND PHASE-INVERSION FREE PHASE DETECTORS

This application is the US national phase of international application PCT/SE01/01357 filed 15 Jun. 2001 which designated the U.S.

TECHNICAL FIELD OF THE INVENTION

The present invention generally relates to phase detectors, and more specifically to direction sensitive phase detectors.

BACKGROUND OF THE INVENTION

Phase detectors are found in numerous applications of all modern technologies. They are widely used in areas of electronics and in different fields of communication, in particular the field of telecommunication.

Basically, a phase detector is an arrangement for measuring a phase difference between two input signals. In a typical application, the phase detector is used in a phase-locked loop (PLL). A phase-locked loop is generally a circuit for synchronizing an output signal of the loop with an input reference signal in frequency as well as in phase, and it is often used in retiming and frequency synthesization applications. In order to accomplish the synchronization of the reference signal and the loop output signal, a phase detector is required for continuously measuring the phase difference between the two signals, and the measured phase difference is utilized for controlling the frequency of the loop output signal.

Figure 1:
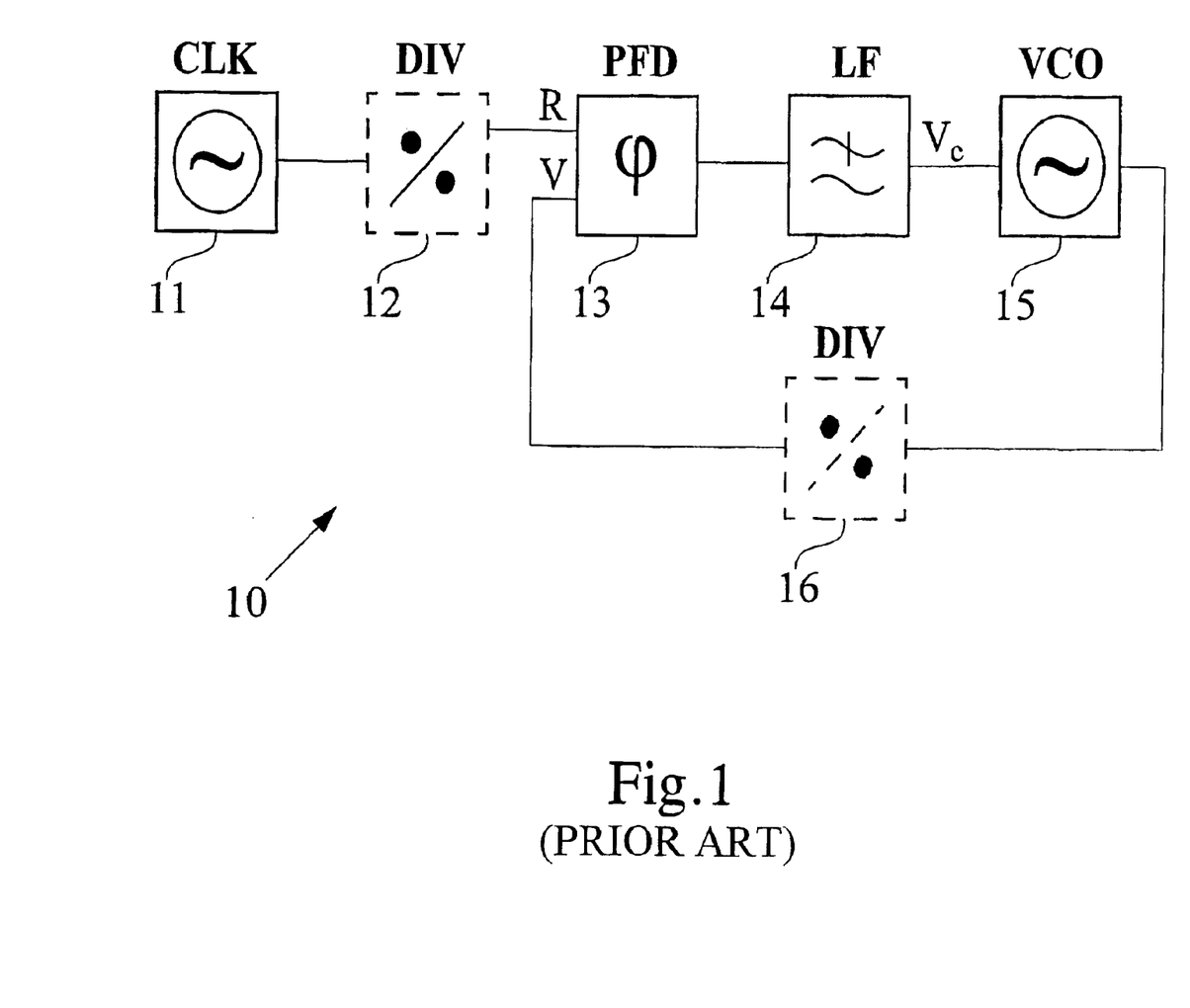
FIG. 1 is a schematic block diagram of a conventional phase-locked loop.

FIG. 1 is a schematic block diagram of a conventional phase-locked loop. The PLL 10 basically includes a phase detector (PD) 13, a loop filter (LF) 14 and an output clock signal source such as a voltage-controlled oscillator (VCO) 15. The phase detector 13 is generally responsive to the output signal (V) of the VCO 15 and an incoming reference clock signal (R) provided by a reference clock signal source 11 for generating a phase difference representing signal. The loop filter 14 averages or integrates the phase difference representing signal to produce a control voltage ($V_C$) for the VCO 15. For generality, it should be understood that the PLL may very well be associated with frequency dividers, for example a first divider 12 for the reference clock signal from the reference clock source 11 and a second divider 16 for the output clock signal of the VCO 15 in the feedback loop.

The synchronization is achieved by frequency correction of the loop output signal in response to the phase difference measured by the phase detector. In the synchronized state, also referred to as the locked state or steady state, there is a predefined mandatory phase relation between the VCO output clock signal and the input reference clock signal, and there is generally no average frequency offset between the signals. However, if there is an instantaneous phase jump, or if a phase difference starts to build up, e.g. due to a frequency offset between the loop output signal and the reference signal, the phase-locked state is lost and the inherent control mechanism of the PLL strives to eliminate the frequency offset and find the phase-locked state again.

Of special interest is the impact of different phase detector (PD) choices on the overall PLL performance such as lock-in procedure and range, static phase error at lock and sensitivity to input clock anomalies. Two phase detectors are commonly used, the simple XOR gate (digital multiplier) and the direction sensitive phase-frequency detector (PFD).

Digital Multiplier

For the XOR gate based PLL, lock acquisition is totally unaided. Lock acquisition starts in a random direction until the proper direction is stumbled onto and ends when the loop filter has been charged to proper voltage for nominal output frequency and zero phase error at the phase detector input. If the reference clock behaves abnormal with a large content of harmonics to the fundamental reference clock frequency, a PLL utilizing an XOR gate PD may falsely lock to a harmonic since it has no frequency selection capability. On the other hand the averaging nature of the XOR gate PD reduces the PLL sensitivity to noise and other disturbances.

Phase Frequency Detector

However, to obtain a more structured lock acquisition procedure rather than pure random operation, it is advisable to use a phase frequency detector (PFD), which differentiates between frequency and pure phase mismatches and introduces so-called direction sensitivity. The phase frequency detector is a multi-state detector, which is capable not only of measuring the magnitude of the phase difference, but also of indicating the lead/lag relation between the clock signals. In this way, the frequency of the loop output signal can generally be altered directly in the right direction without losing valuable time.

Figure 2:
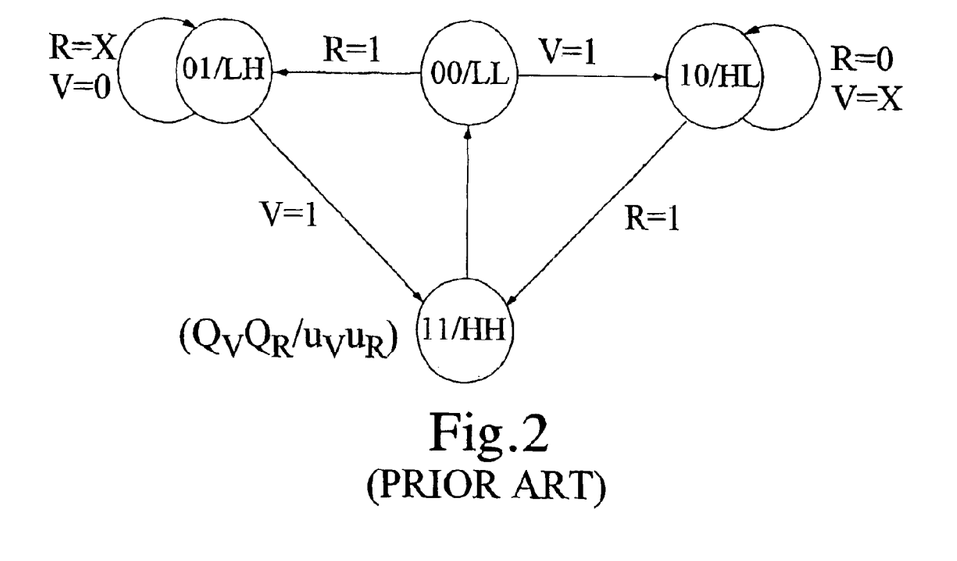
FIG. 2 is a schematic state diagram representation of state machine for a conventional phase frequency detector.

FIG. 2 is a schematic state diagram representation of state machine for a conventional phase frequency detector. The PFD state machine has four different states denoted 00/LL, 01/LH, 10/HL and 11/HH, and alternates between two distinct control loops depending on the lead/lag relation between the clock signals. The transition conditions are associated with the signal states of the input clock signals to the PFD state machine, and indicated along the transition lines in the state diagram.

Figure 3:
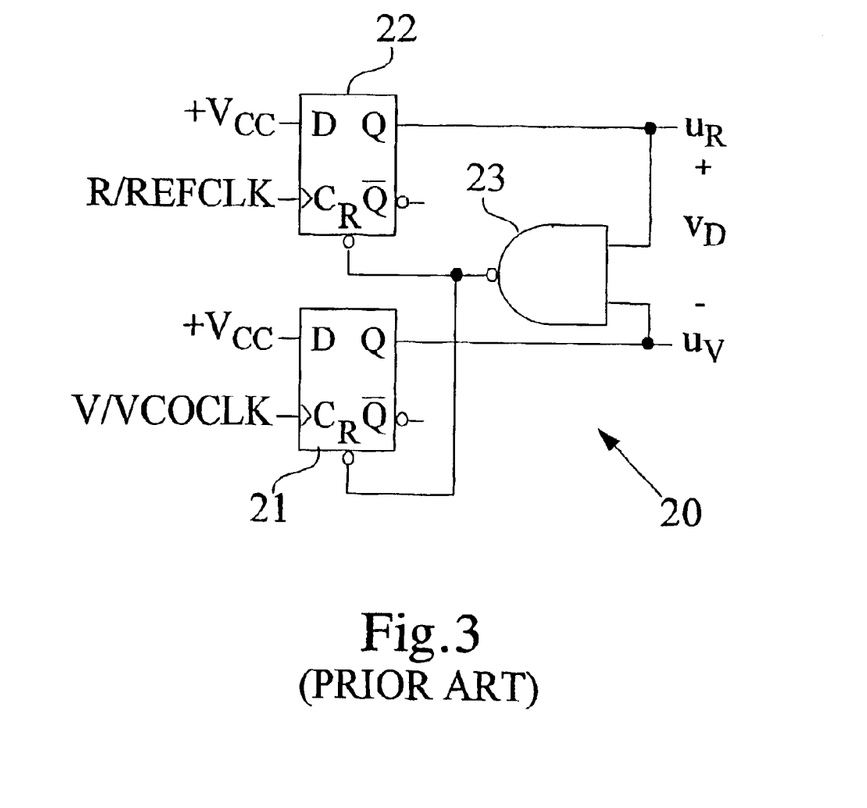
FIG. 3 is a circuit diagram of an implementation of the PFD state machine of FIG. 2.

FIG. 3 is a circuit diagram of a typical implementation of the PFD state machine of FIG. 2. The PFD implementation 20 is based on D flip-flops (DFFs) 21, 22 and a NAND gate 23. The phase detector is triggered by positive edge transitions, and fed by a supply voltage ($V_{CC}$). The phase detector has a step-up frequency output terminal (retard phase terminal) $u_R$ and a step-down frequency output terminal (advance phase terminal) $u_V$. As indicated in FIG. 2, the physical phase detector output voltages $u_V$ and $u_R$, coded as L (Low) or H (High), are associated with the state variables $Q_V$ and $Q_R$, respectively.

In the PLL, the frequency of the loop output signal is adjusted when the loop filter integrator is charged or discharged by the phase frequency detector output. Irrespective of the initial state of the PFD, only the DFF that receives a positive edge transition on the associated PFD input will be active with a high Q output. Whenever one of the input clocks lag in frequency, only one PFD output terminal is active to signal the direction of the regulation to speed up the clock with lower frequency. For example, if the reference clock is ahead of the VCO clock, then $u_R$ is high (H) with $U_V$ constantly low (L) corresponding to the state 01/LH in the state diagram of FIG. 2, and the loop filter integrator is charged, thus increasing the VCO control voltage and the VCO output frequency. For a lagging reference clock the situation is reversed and $u_R$ is low (L) with $u_V$ high (H) corresponding to the state 10/HL so that the loop filter integrator is drained of charge and the VCO output frequency is lowered. Due to the asynchronous implementation there is an intermediate state 11/HH that is implicitly formed from the finite reset time of the state variables (DFFs) in the transitions to the ground state 00/LL. Missing clock pulses in the reference clock will be interpreted by the PFD as a frequency mismatch, and to prevent the PLL from reacting with abrupt output frequency changes a resonant circuit, a so-called Q-tank, is normally arranged prior to the reference clock input of the PFD.

Compared to a PLL based on a multiplier phase detector that averages the phase difference with no built in directivity, a more well defined lock acquisition procedure is obtained with a direction sensitive PFD type detector. However, conventional PFD type detectors suffer from problems with so-called phase inversion.

Phase Inversion

For a PLL based on a direction sensitive PFD detector there are always at least two different trajectories or paths that lead to phase lock from a given initial phase relation between the reference clock and the loop output clock. Since the loop output clock may be advanced or retarded the phase difference ($\theta_e$) is reduced to zero either the shortest distance ($\theta_e$) or the longer distance ($360°-\theta_e$) from the complementary direction. For the common phase frequency detector that has a linear range including both possibilities, a disturbance may shift the phase detector state such that the control system is forced to minimize the very large complementary phase error producing a large amount of output jitter during such a relock acquisition. For example, such a phase inversion situation may occur during reference clock loss.

Figure 4:
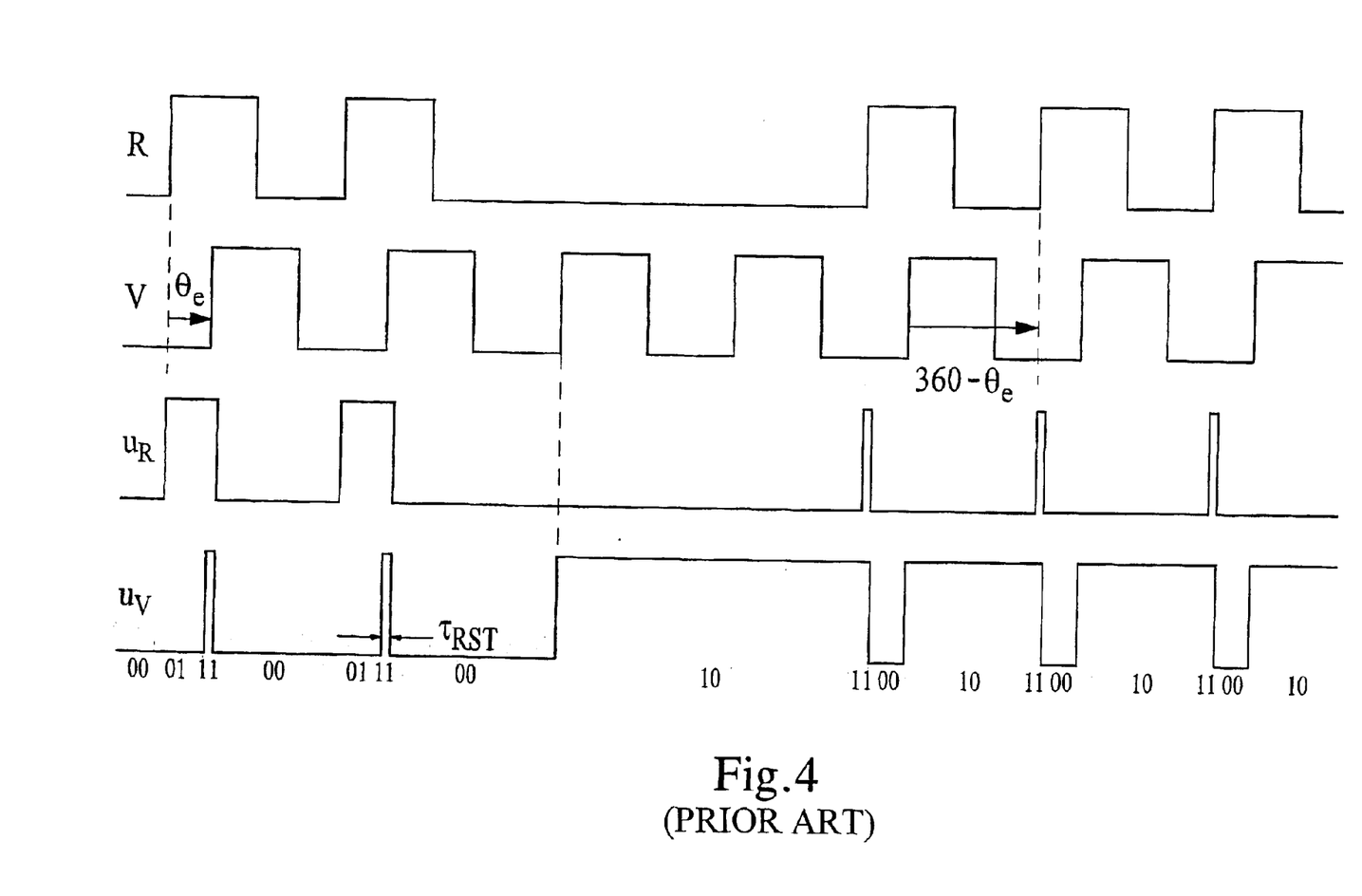
FIG. 4 is a schematic timing diagram illustrating a phase inversion situation during reference clock loss.

FIG. 4 is a schematic timing diagram illustrating a phase inversion situation during reference clock loss. The timing diagram illustrates a reference clock R and a loop output signal V tracking the reference clock. Also shown in the timing diagram are the output signals $u_V$ and $u_R$ of the PFD state machine. As can be seen from timing diagram, the PFD state machine is initially in the ground state 00 waiting for a next positive edge transition. As the first positive transition of the reference clock R occurs, $u_R$ goes high and the PFD state machine transitions into the state 01 in which it starts measuring the phase difference between the two clocks R and V. As the first positive transition of the loop output clock V occurs, $u_V$ goes high and the PFD state machine transitions into the reset state 11. In a typical application, the output signals $u_V$ and $u_R$ of the PFD state machine drives the frequency of the loop output clock V during the entire phase difference measurement interval between the positive transition of R and the positive transition of V. Alternatively, in an all-digital control system, the phase difference $\theta_e$ is extracted at the end of the measurement interval and subsequently used in the regulation of the loop output clock V. After a finite reset time $t_{rst}$, the PFD state machine is back in its ground state 00 where it awaits the next phase difference measurement, and so on. Apparently, the state machine operates in the state trajectory 00-01-11-00. However, after some time, the reference clock R is temporarily lost. After being reset to its ground state 00 the second time, the state machine now transitions into the alternative state 10 since the loop output clock V goes high (indicated by a dashed line) before the reference clock R, which is now missing. Once the reference clock R has returned, $u_R$ goes high and the PFD state machine transitions into the reset state 11, and subsequently into the ground state 00 where it awaits the next phase difference measurement. However, now the state machine is put into the reset state by a positive R transition instead of a positive V transition. This means that the state machine operates in the alternative state trajectory 00-10-11-00 and the phase information has shifted to the complementary ($360°-\theta_e$), which is much larger than the initial phase error measured before the phase inversion.

Although the phase inversion problem mainly is described in relation to missing reference clock pulses, it is important to understand that other perturbations and faults such as an anomalous loop output clock may also cause phase inversion.

The present invention overcomes these and other drawbacks of the prior art arrangements.

RELATED ART

U.S. Pat. No. 5,191,239 issued on Mar. 2, 1993 to Rogers discloses a reset gate for a phase frequency detector (PFD) in a phase-locked loop for handling an internal PFD race condition.

U.S. Pat. No. 5,691,656 issued on Nov. 25, 1997 to Sandusky is related to the direction sensitivity of phase detector and discloses a latching phase detector. The phase detector includes a reference signal differentiator and an input signal differentiator. Each differentiator has a corner frequency that is easily adjustable to block DC and low frequency offsets. The corner frequency can be adjusted to result in a precise ($n\pi$)/2 latching phase detector, which detects whether the phase difference is greater or less than ($n\pi$)/2 where n is an integer between 1 and 4.

U.S. Pat. No. 5,963,058 issued on Oct. 5, 1999 to Thomas discloses a phase frequency detector, which includes circuitry of transistors configured to adjust an amount of overlap of an up signal and a down signal based upon the magnitude of a phase delay between two clock signals. The circuitry is configured to produce a PFD output signal in which the sign of the phase delay indicated remains the sign of the phase delay between the applied clock signals even as the magnitude of the phase delay approaches 360°.

U.S. Pat. No. 5,920,207 issued on Jul. 6, 1999 to Suresh discloses an asynchronous phase detector. The phase detector includes an asynchronous state machine which simulates an edge triggered J-K flip flop, and the state machine is implemented with logic that provides for optimal sensitivity and minimal dead zone.

SUMMARY OF THE INVENTION

It is a general object of the present invention to provide a robust phase detector, which effectively prevents phase inversion while maintaining direction sensitivity.

In particular, it is desirable to provide the phase detector in a true asynchronous design.

These and other objects are met by the invention as defined by the accompanying patent claims.

The present invention is based on the recognition that conventional direction sensitive phase detectors are susceptible to phase inversion when the reset state has a duration that is smaller than the phase error between the reference clock and the loop output clock, thus not properly masking the complementary state. The general idea according to the invention is to design the phase detector state machine with a reset state that is released only when both phase detector input signals have a common predetermined signal state.

In this way, the complementary phase error is properly masked and the phase detector range is effectively reduced to $-180°<\theta_e<180°$, while still maintaining the direction sensitivity. The alternative state trajectory is simply not available any more since the complementary phase error, $\theta_{ec}=360°-\theta_e>180°$, is larger than half a period, which exceeds the detection range, and is automatically discarded. Consequently, if the phase detector ends up in a state, for example due to reference clock loss, in which the phase error is larger than half a period, the phase detector is shifted back to normal operation with a phase error less than half a period during the next consecutive phase comparison period. Naturally, this saves valuable time in the lock-acquisition procedure.

The phase detector state machine configured with the proposed logic reset state is preferably implemented as a true asynchronous state machine instead of operating with the reset and recovery characteristics of digital flip flops. Designing an asynchronous state machine based on implicitly formed memory elements gives near ideal operation.

The invention offers the following main advantages:

The susceptibility to phase inversion is eliminated, while still maintaining direction sensitivity; and Reduced lock-acquisition time.

Other advantages offered by the present invention will be appreciated upon reading of the below description of the embodiments of the invention.

BRIEF DESCRIPTION OF THE DRAWINGS

The invention, together with further objects and advantages thereof, will be best understood by reference to the following description taken together with the accompanying drawings, in which.

DETAILED DESCRIPTION OF EMBODIMENTS OF THE INVENTION

Throughout the drawings, the same reference characters will be used for corresponding or similar elements.

It should be understood that the reference to PLL applications is intended to merely serve as a framework for an understanding of the present invention, and that the invention is not limited thereto. In fact, the phase detectors according to the invention can be used in any type of application where it is desirable to measure a phase difference between two input signals.

Figure 5:
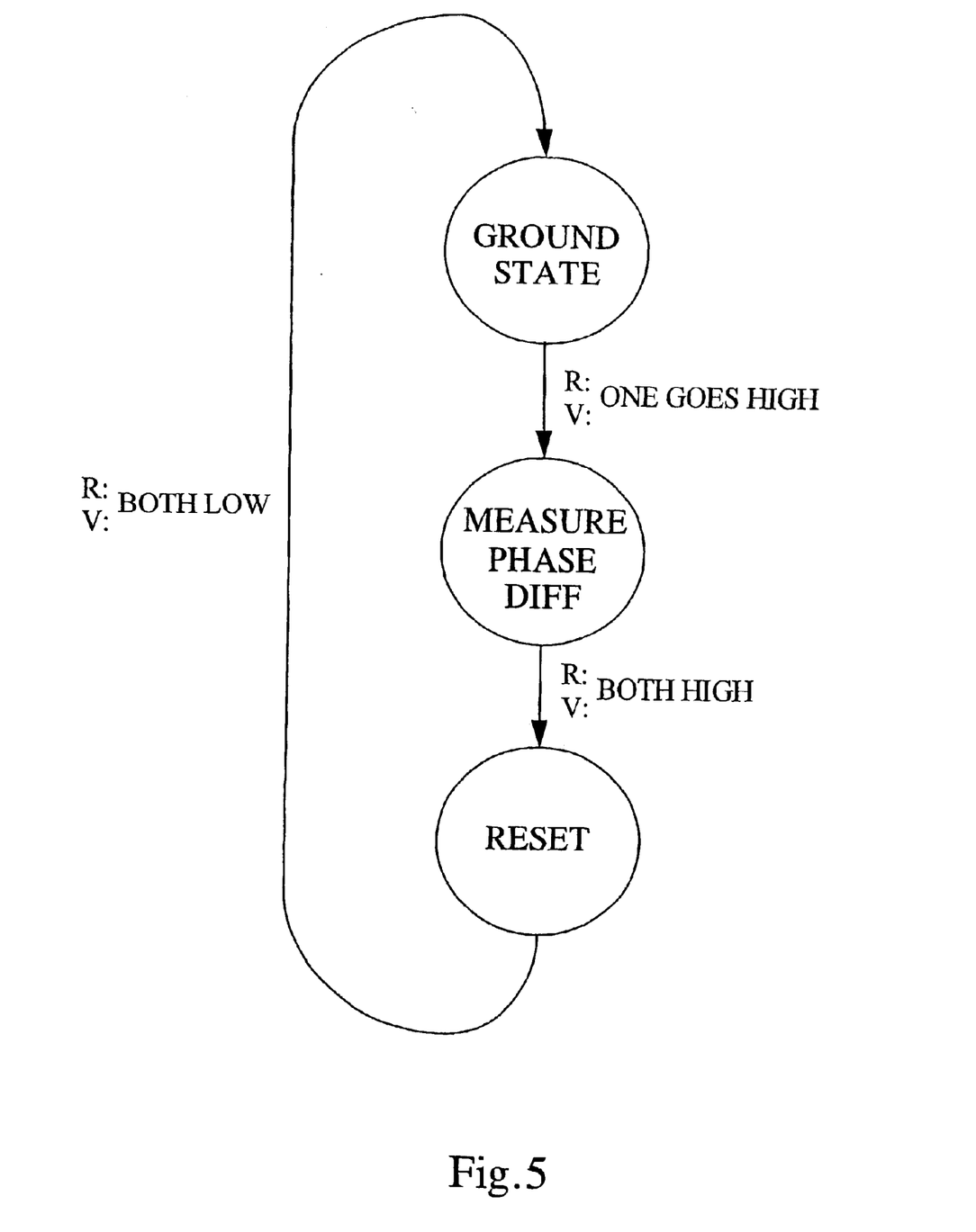
FIG. 5 is a state diagram representation of a state machine for a phase detector according to a general embodiment of the invention.

FIG. 5 is a state diagram representation of a state machine for a phase detector according to a general embodiment of the invention. The state diagram is representative of a phase detector state machine triggered by positive edge transitions. The state machine is initially in the ground state, in which both the reference clock R and the loop output clock V are low, waiting for a next positive transition in any of the two phase detector input clocks. As one of the phase detector input clocks R, V goes high the state machine transitions into a measurement state in which the phase difference between the two clocks is being measured. If the reference clock R goes high first, the phase difference measurement is made relative to the reference clock and completed once the loop output clock V goes high. The other way around, if the loop output clock V goes high first, the phase difference measurement is made relative to the loop output clock and completed once the reference clock goes high. Anyway, as soon as both phase detector input clocks R, V are high, the phase difference measurement is completed and the state machine transitions into a logic reset state. According to the invention, the reset state is held until both phase detector input clocks are low. The transition between the reset state and the ground state is not automatic as for conventional direction sensitive phase detectors, where the reset time is determined only by circuit-dependent delays. Instead, the reset state is an inherent part of the state machine logic and not released until both input clocks R, V has actually gone low. In practice, this means that once the overall PLL has started locking the loop output clock towards the reference clock from a certain direction, the logic reset state and its associated transition condition will make sure that the PLL continues to track down the reference clock from the same direction throughout the entire lock-in procedure, as will be explained in more detail below. Thus, phase inversion is effectively eliminated.

Figure 6:
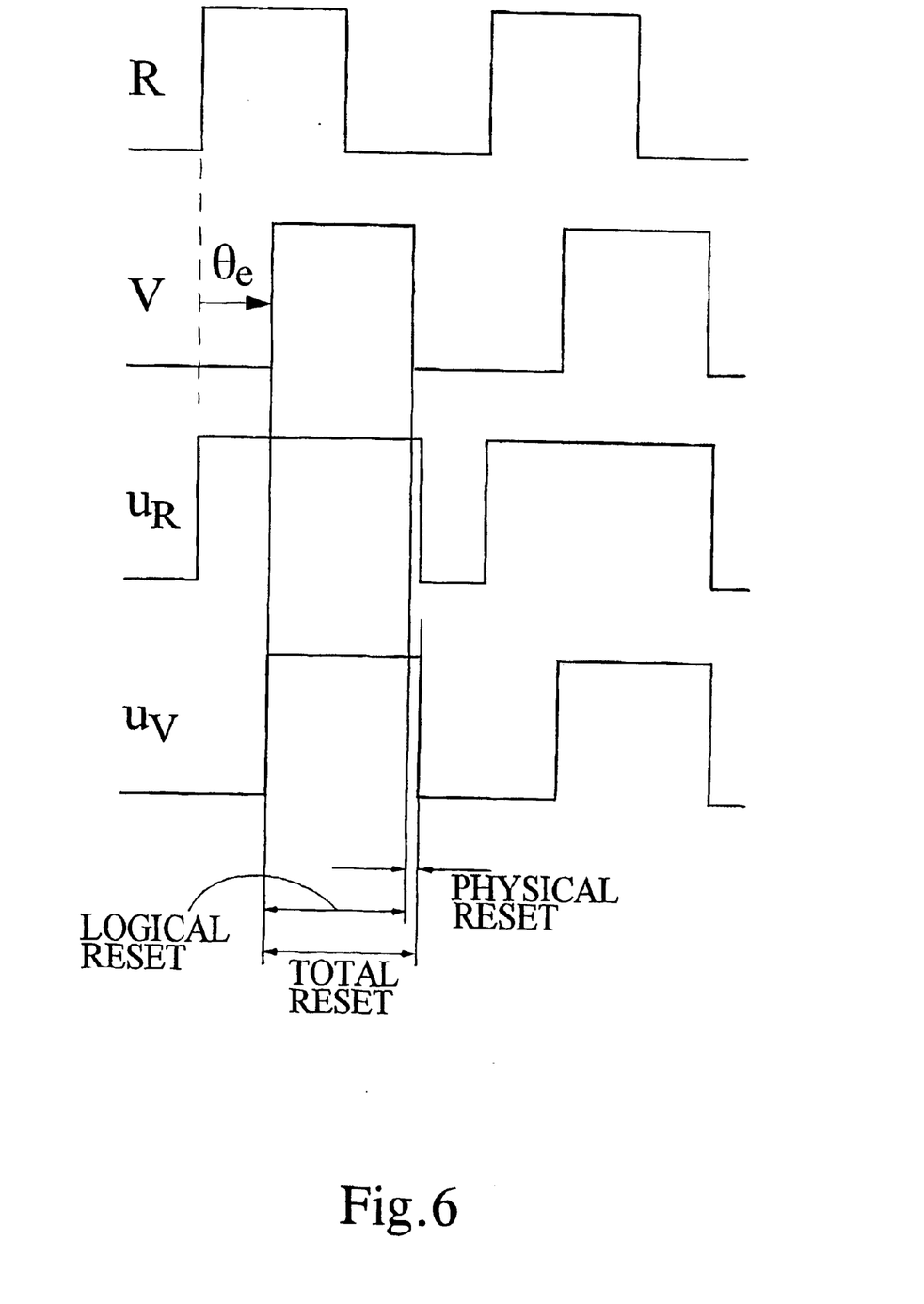
FIG. 6 is a schematic timing diagram illustrating the basic operation of a phase detector according to a general embodiment of the invention.

FIG. 6 is a schematic timing diagram illustrating the basic operation of a phase detector according to a general embodiment of the invention. The timing diagram illustrates a reference clock R and a loop output signal V tracking the reference clock. Also shown in the timing diagram are the output signals $u_V$ and $u_R$ of the phase detector state machine. As can be seen from timing diagram, the state machine transitions into a logic reset state, with $u_V$ and $u_R$ both high, once the tracking loop output clock V has gone high and the phase difference $\theta_e$ has been measured. In contrast to conventional direction sensitive phase detectors, in which the reset state only is a physical and circuit-dependent reset of very short duration, the reset state according to the invention is an integral part of the state machine logic which is released only when both input clocks R, V has gone low. As can be seen in the timing diagram of FIG. 6, the logical reset of the state machine is followed by a physical reset implicitly formed from the finite reset time of the state machine circuitry. The logical reset is embedded in the state machine and constitutes the phase inversion removal logic of the phase detector according to the invention.

Figure 7:
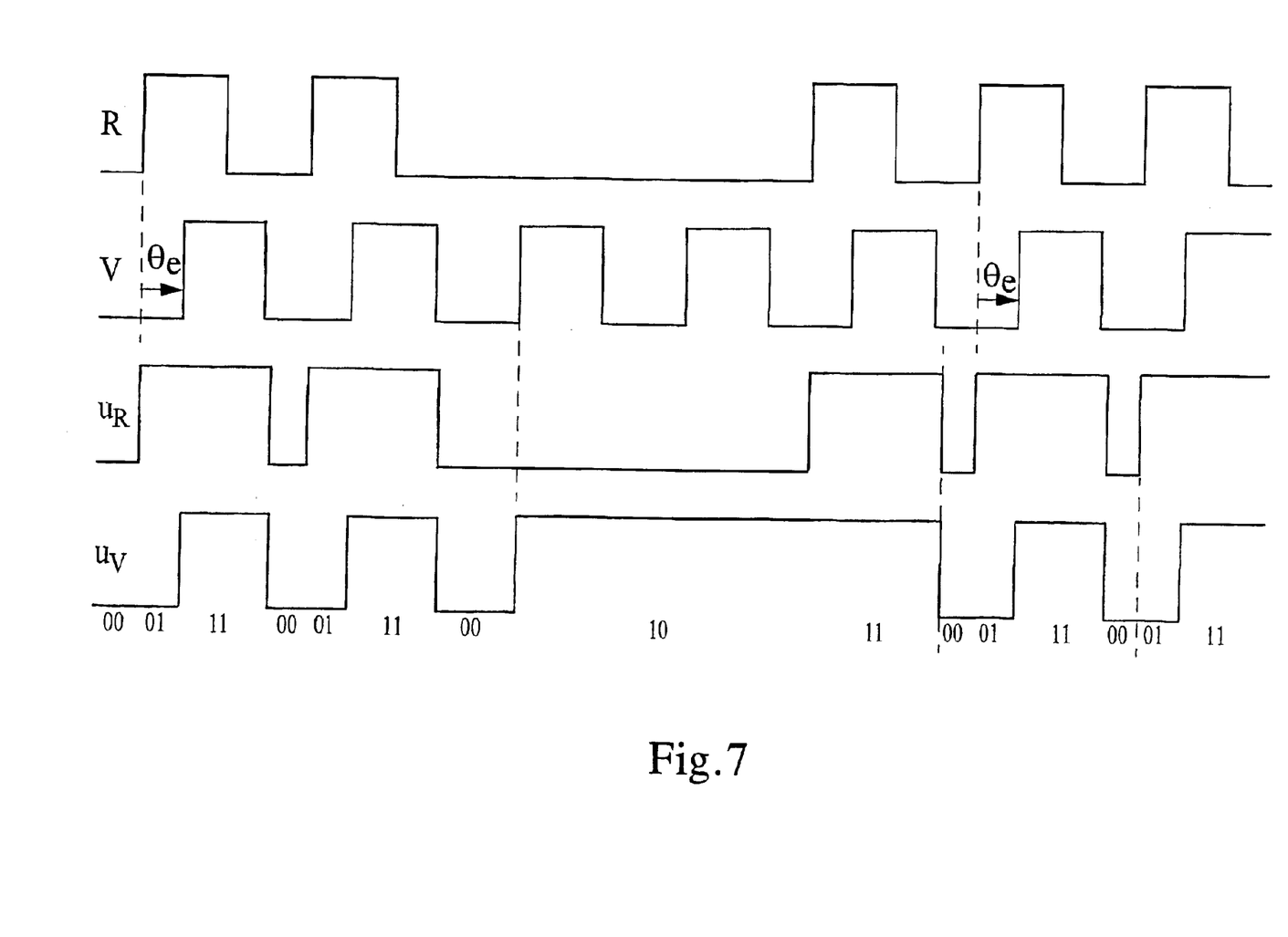
FIG. 7 is a schematic timing diagram illustrating the prevention of phase inversion during reference clock loss.

FIG. 7 is a schematic timing diagram illustrating the prevention of phase inversion during reference clock loss. As can be seen from timing diagram, the phase detector state machine is initially in the ground state 00 waiting for a next positive edge transition. As the first positive transition of the reference clock R occurs, $u_R$ goes high and the state machine transitions into the state 01 in which it starts measuring the phase difference between the two input clocks R and V. As the first positive transition of the loop output clock V occurs, $u_V$ goes high and the PFD state machine transitions into the reset state 11. At the same time, the phase difference $\theta_e$ is extracted and used in the regulation of the loop output clock V. The state machine is held in its reset state until both input clocks R, V has gone low, and then transitions into the ground state 00 where it awaits the next phase difference measurement, and so on. Apparently, the state machine operates in the state trajectory 00-01-11-00. After some time, the reference clock R is temporarily lost. After being reset to its ground state 00 the second time, the state machine now transitions into the alternative state 10 as the loop output clock V goes high (indicated by a dashed line) before the reference clock R, which is now missing. During the anomalous reference clock behavior, the measured phase difference is clearly incorrect and the phase error must be handled carefully, for example by using a Q-tank or by means of an inhibit procedure. Once the reference clock R returns, $u_R$ goes high and the PFD state machine transitions into the reset state 11. However, since the reset state of the proposed state machine is released only when both phase detector input clocks R, V are low, the complementary phase error $(360°-\theta_e)$ is effectively masked, and during the next consecutive phase comparison period, the phase detector state machine is back into the correct phase relation again. Thus, an erroneous behavior with a phase error larger than half a period can only exist during one phase comparison period succeeded by a state change that brings the state machine back into the correct state trajectory again.

For a more thorough understanding of the invention, illustrative state diagrams, Karnaugh diagrams and circuit diagrams of preferred embodiments of the invention will now be described with reference to FIGS. 8–13.

In general, the asynchronous relation between the two clocks R, V lend it natural to use an asynchronous state machine implementation without any explicit memory elements (flip-flops) and no system clock. Instead the state information is preferably kept (statically preserved) through a feedback loop where the delay of the combinatorial network separates the current state from the next state. All possible input signal combinations and sequences must lead to stable successor states, thus requiring a stationary feedback loop. With different delay paths through the combinatorial feedback network another common requirement is that only one input signal at a time may induce a state change to avoid possible race conditions and that the state coding must be such that only one bit in the state code may change at a time, similar to a Gray coded finite state machine (FSM). Direct decoding, i.e. a Moore FSM, is preferably used to minimize the skew between the two phase detector outputs and thus lower the residual phase error at lock. Thus, the phase detector outputs $u_V$ and $u_R$ are directly decoded from the state variables $q_V$ and $q_R$, respectively:

$$u_V = q_V$$

$$u_R = q_R.$$

At phase lock the output signals from the phase detector both have a high/low ratio (duty cycle) that is the largest of the input waveforms. The strain and speed grade requirements on the output buffers are more relaxed compared with other common PFD implementations that experience short reset spikes in locked mode. Nominal output signals (50% duty cycle) at phase lock results in an average voltage (DC) of half the supply voltage ($V_{CC}$) which gives ideal bias in the middle of the common mode range for the operational amplifier in an active loop filter (LF). The largest pulse width of the input signals should be limited in order not to reduce the phase detector range more than necessary. Otherwise the lock acquisition performance may be affected.

Even if the detector is positive edge triggered it is advisable and strongly recommended to apply input signals with close to one half period high logic level. A dead band with the phase detector outputs stuck high exist when the two input clocks are in antiphase (around 180° phase error). Enclosed by a phase locked loop additional effects such as noise, oscillator jitter and frequency offsets secure that the phase detector never remains in this condition indefinitely.

Figure 8:
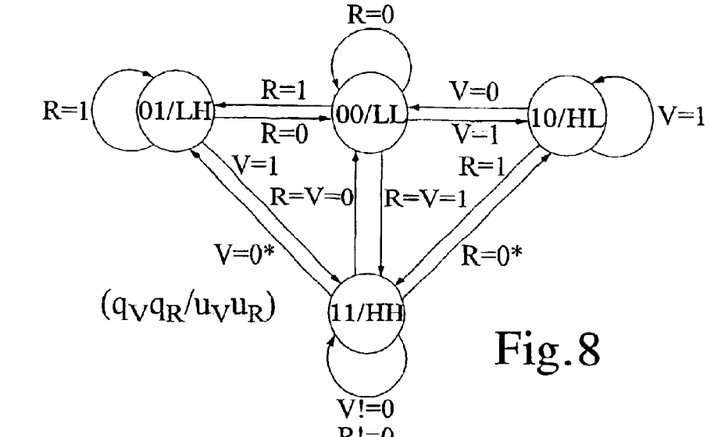
FIG. 8 is a state diagram representation of a state machine for a phase detector according to a first preferred embodiment.

FIG. 8 is a state diagram representation of a state machine for a phase detector according to a first preferred embodiment. The phase detector state machine has four different states denoted 00/LL, 01/LH, 10/HL and 11/HH. The transition conditions are associated with the signal states of the input clock signals to the phase detector state machine, and indicated along the transition lines in the state diagram. In the ground state 00/LL, the state machine awaits the first positive transition on either the reference clock (R) or the loop output clock (V) inputs of the phase detector. Directivity is preserved since a leading loop output clock edge will trigger a state change to the state 10/HL with the step down frequency output $u_V$ high, and a leading reference clock edge will trigger a state change to the state 01/LH with the step up frequency output $u_R$ high; in both cases the other output remains low. In contrast to a phase and frequency sensitive detector, the phase detector state machine of FIG. 8 may return to the ground state 00/LL from any of the states 10/HL and 01/LH if there is a falling edge on the leading input. A direct implication of this feature is that the detector is less sensitive to glitches on the clock inputs R, V since a glitch is merely replicated on the output and is not interpreted as a frequency mismatch between the two clocks. However, once the state machine has transitioned into the reset state 11/HH it is held there until both the reference clock R and the loop output clock V has gone low. In other words, the reset state is not released as long as any of the input clocks R, V differs from zero (V!=0, R!=0). As indicated in the state diagram of FIG. 8, three paths are feasible for the transition to the ground state, either 11-00, 11-01-00 or 11-10-00. In practice, implementation characteristics and physical properties will determine which path that is selected back to the ground state, once both input clocks has gone low. Formally, the phase detector state machine does not fully comply with the requirement that all state transitions should have a dispersion less than or equal to 1 (Gray coded transitions). However, since no absorbing intermediate states exist between the reset state and the ground state, together with the fact that all other possible (physical) reset paths, i.e. 11-01-00 and 11-10-00, are valid, the detector operates flawless in all kinds of situations without malfunction due to asynchronous race conditions.

Figure 9:
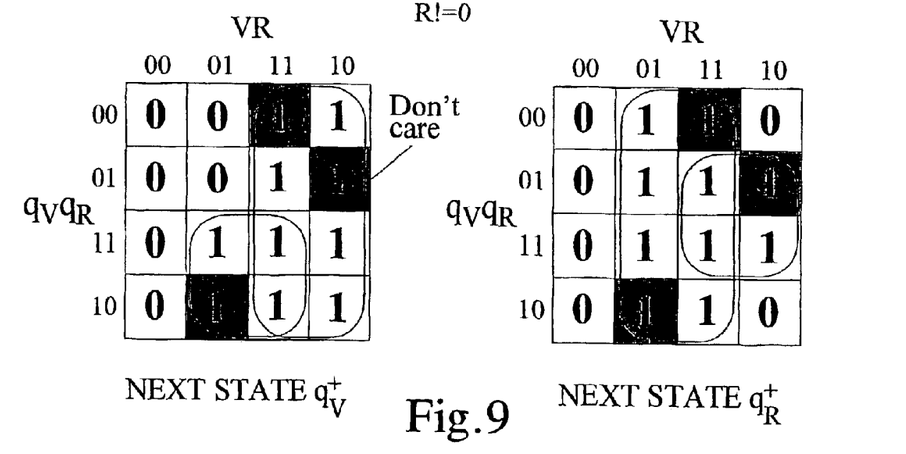
FIG. 9 are next state Karnaugh diagrams based on the state diagram of FIG. 8.

A Karnaugh diagram is generally a powerful tool for circuit implementation and logic minimization. In particular, it can be used as a graphical method to present the next state (function) with the phase detector presently in any current state for all input signal combinations FIG. 9 are next state Karnaugh diagrams based on the state diagram of FIG. 8. Here, each one of the next state variables $q_V^+$ and $q_R^+$ is treated in a separate matrix type of diagram with all input clock signal combinations on the horizontal axis and the current state on the vertical axis. Consequently, a row is in fact associated with a particular state and each cell in such a row has a value which is the new or updated state (variable) given a certain input clock signal combination. So-called "Don't care" states are indicated by shadowing. The circled portions of the graph represent logic optimization since any two adjacent cells with the same logic levels reveal that the corresponding signal or state variable does not influence the next state boolean function. The next state is formed by a logic function which depends on the current state (via feedback) and the logic values of the input signals that ultimately trigger all state transitions. The boolean (logic) function is formed as a superposition of all individual conditions. Overlapping/connected areas of logic state "1" are vital to maintain a hazard free (no glitches) implementation of the next state functions.

Figure 10:
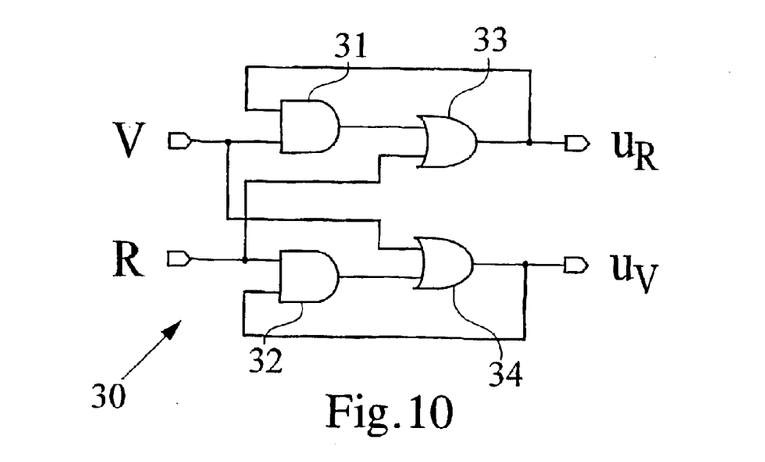
FIG. 10 is a circuit diagram of a preferred implementation of the state machine represented by the Karnaugh diagrams of FIG. 9.

FIG. 10 is a circuit diagram of a preferred phase detector implementation of the state machine represented by the Karnaugh diagrams of FIG. 9. The phase detector 30 basically comprises two AND gates 31, 32 and two OR gates 33, 34 arranged in a fully symmetric configuration. The AND gate 31 receives the loop output clock V at one input and the phase detector output signal $u_R$ at the other input. The AND gate 32 receives the reference clock R at one input and the phase detector output signal $u_V$ at the other input. The output of the AND gate 31 is connected to one input of the OR gate 33, which also receives the reference clock R at the other input to produce the phase detector output signal $u_R$. The output of the AND gate 32 is connected to one input of the OR gate 34, which also receives the loop output clock V at the other input to produce the phase detector output signal $u_V$. In other words, the phase detector of FIG. 10 operates according to the following logic expressions:

$$u_V = V \text{ OR } (u_V \text{ AND } R)$$

$$u_R = R \text{ OR } (u_R \text{ AND } V).$$

Figure 11:
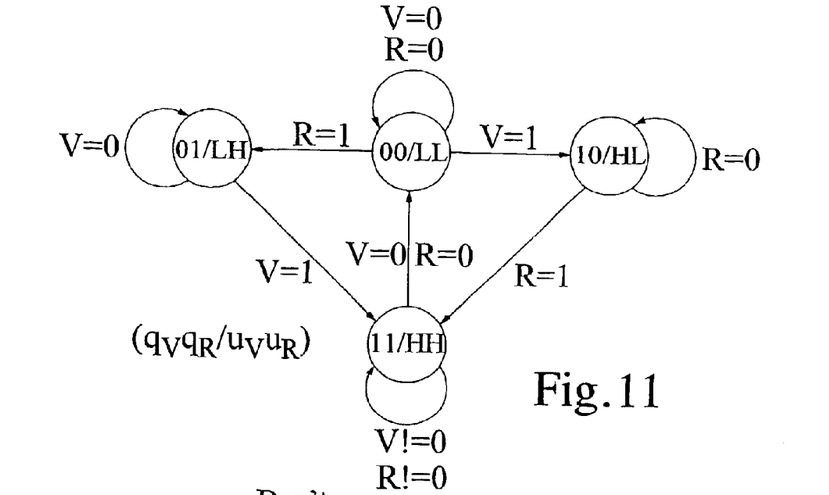
FIG. 11 is a state diagram representation of a state machine for a phase frequency detector according to a second preferred embodiment.
Figure 12:
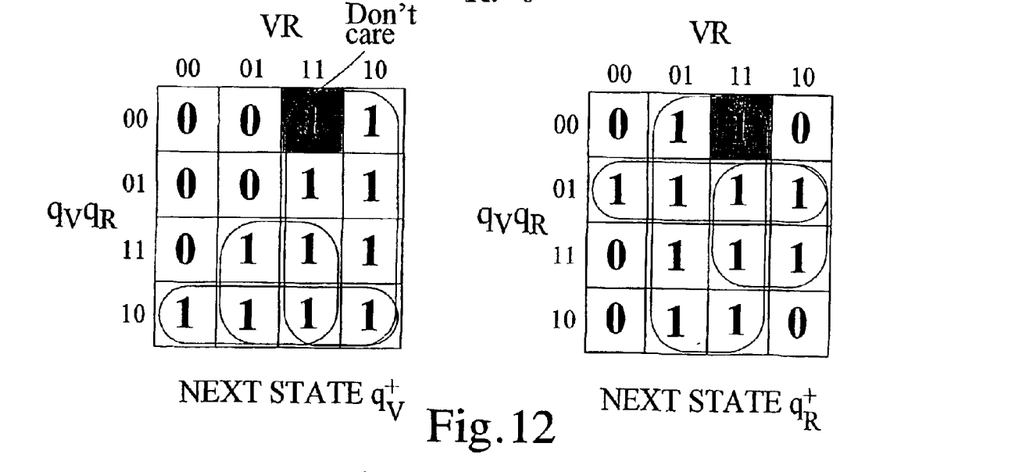
FIG. 12 are next state Karnaugh diagrams based on the state diagram of FIG. 11.

FIG. 11 is a state diagram representation of a state machine for a phase frequency detector according to a second preferred embodiment. Corresponding illustrative next state Karnaugh diagrams are shown in FIG. 12. In similarity to the phase detector state machine represented by FIG. 8, directivity is preserved since a leading loop output clock edge (V=1) will trigger a state change to the state 10/HL, and a leading reference clock edge (R=1) will trigger a state change to the state 01/LH. For wideband PLL applications additional lock acquisition aid is achieved if the phase frequency detector never returns to its ground state when several transitions on one of the inputs occur between two consecutive transitions on the other input. Additional information about the frequency mismatch is thus gained. Once the phase comparison period is completed, the state machine transitions into the reset state 11/HH, which is released only when both the reference clock R and the loop output clock V has gone low. However, here the transition from the reset state 11/HH to the ground state 00/LL has no well defined path since either intermediate state 01/LH or 10/HL would act absorbing and the ground state would not be reached. In practice though, depending on skew ratio and total delay, a full transition sequence with a direct transition from the reset state to the ground state can be completed if the detector is designed and matched properly.

Figure 13:
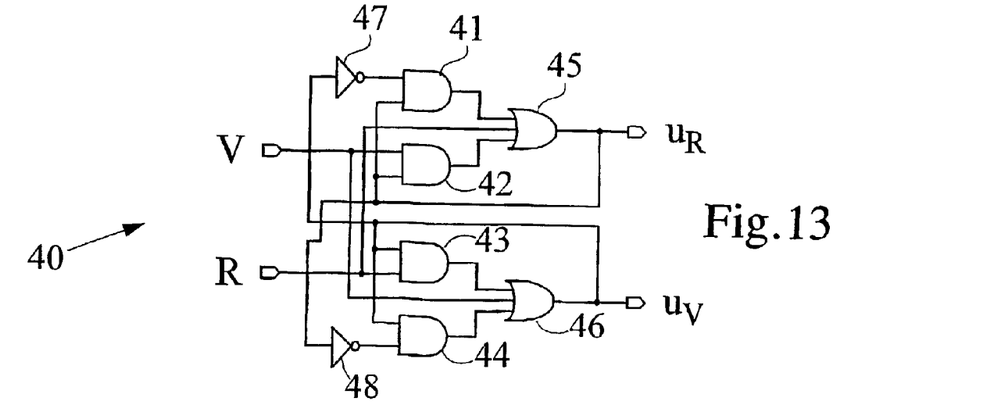
FIG. 13 is a circuit diagram of a preferred implementation of the state machine represented by the Karnaugh diagrams of FIG. 12.

FIG. 13 is a circuit diagram of a preferred implementation of the state machine represented by the Karnaugh diagrams of FIG. 12. The phase frequency detector (PFD) 40 basically comprises a number of AND gates 41, 42, 43 and 44, OR gates 45, 46 and inverters 47, 48 arranged in a fully symmetric configuration, which operates according to the following logic expressions:

$$u_V = V \text{ OR } (u_V \text{ AND } R) \text{ OR } (u_V \text{ AND } \bar{u}_R)$$

$$u_R = R \text{ OR } (u_R \text{ AND } V) \text{ OR } (u_R \text{ AND } \bar{u}_V).$$

Instead of trying to match and balance a circuit implementation based on the state diagram of FIG. 11 and the Karnaugh diagrams of FIG. 12, an alternative approach for solving the hazardous reset back to the ground state would be to introduce further states. An example of such a higher-order state machine will be described briefly below with reference to FIG. 14.

Figure 14:
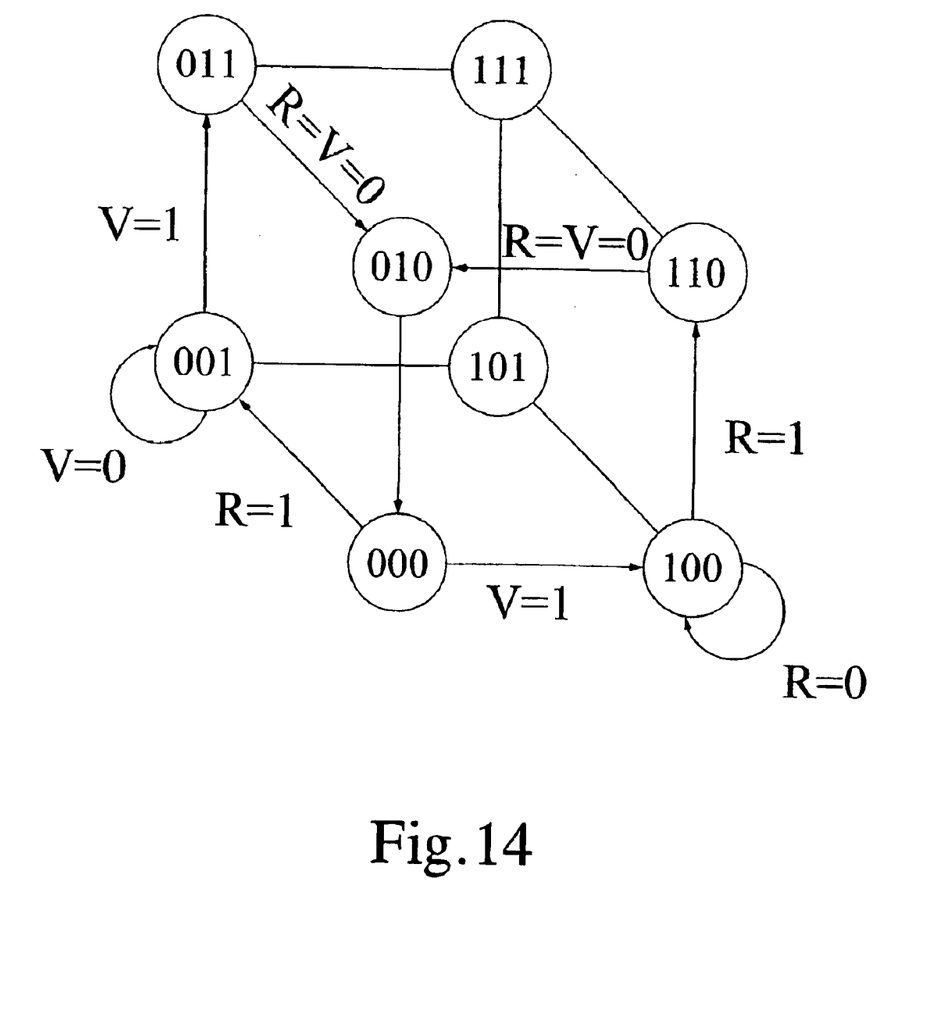
FIG. 14 is a three-dimensional state diagram representation of a higher order phase detector state machine according to the invention.

FIG. 14 is a three-dimensional state diagram representation of a phase detector state machine according to the invention. The state coding now uses three bits ($q_1$, $q_2$, $q_3$) and the phase detector outputs $u_V$ and $u_R$ are decoded from the state variables $q_1$, $q_2$ and $q_3$:

$$u_V = q_1 \text{ or } q_2$$

$$u_R = q_2 \text{ or } q_3.$$

To obtain a race free design, all state transitions should occur along the edges of the three-dimensional state cube so no diagonal transitions are allowed. Each corner of the state cube is associated with a state code that differs only in one bit from the state code of neighboring corners (dispersion equal to 1). In general, only the principal transition conditions are marked along the transition lines. It should be noted from the state diagram of FIG. 14 that when both input clocks R, V has gone low, the reset state is released in two transitions, either 011-010-000 or 110-010-000, with an immediate and conditionless transition from 010 back to the ground state 000.

Of course, even further states can be introduced and a general form of such a race free state machine involves $2^n$ states, where n is an integer equal to or greater than 3, and all state transitions occur along the edges of an n-dimensional state cube.

Alternative hardware implementations other than those shown in FIGS. 10 and 13 can easily be designed based on the corresponding state diagrams. For example, commercially available software programs can be utilized to translate state diagrams, state tables or other similar representations into suitable form for hardware implementation. Of course, in order to build a software PLL, the state machine according to the invention can be realized purely in software. In fact, it should be understood that the invention can be realized in hardware, software or any combination thereof.

Although the invention has been described with reference to positive edge triggered implementations, it should be understood that the invention of course is not limited thereto and that negative edge triggered implementations are equally feasible.

The embodiments described above are merely given as examples, and it should be understood that the present invention is not limited thereto. Further modifications, changes and improvements which retain the basic underlying principles disclosed and claimed herein are within the scope of the invention.

What is claimed is:

1. A direction sensitive phase detector based on a state machine that is responsive to a first input signal and a second input signal, wherein the state machine is configured to have a reset state which is released only when both said first input signal and said second input signal have a common predetermined signal state, thereby preventing phase inversion during phase detector operation.

2. The direction sensitive phase detector according to claim 1, characterized in that said state machine is an asynchronous state machine based on implicitly formed memory elements.

3. The direction sensitive phase detector according to claim 2, characterized in that said asynchronous state machine is implemented as a combinatorial network and that state information is held through a feedback loop where the delay of said combinatorial network separates the current state from the next state.

4. The direction sensitive phase detector according to claim 1, characterized in that said state machine is configured such that only one of said first input signal and said second input signal may induce a state change, thereby avoiding possible race conditions.

5. The direction sensitive phase detector according to claim 1, characterized in that said state machine generates a first state machine output signal and a second state machine output signal, and said state machine is implemented by logic having:

- a first AND gate responsive to said first input signal and said second state machine output signal;
- a second AND gate responsive to said second input signal and said first state machine output signal;
- a first OR gate responsive to the output of said first AND gate and said second input signal to produce said second state machine output signal; and
- a second OR gate responsive to the output of said second AND gate and said first input signal to produce said first state machine output signal.

6. The direction sensitive phase detector according to claim 1, characterized in that said state machine is implemented by logic operating according to the following expressions:

$$u_V = V \text{ OR } (u_V \text{ AND } R)$$

$$u_R = R \text{ OR } (u_R \text{ AND } V),$$

where $u_V$ is a first state machine output signal, $u_R$ is a second state machine output signal, V is said first input signal and R is said second input signal.

7. The direction sensitive phase detector according to claim 1, characterized in that said state machine is implemented by logic operating according to the following expressions:

$$u_V = V \text{ OR } (u_V \text{ AND } R) \text{ OR } (u_V \text{ AND } \overline{u_R})$$

$$u_R = R \text{ OR } (u_R \text{ AND } V) \text{ OR } (u_R \text{ AND } \overline{u_V}),$$

where $u_V$ is a first state machine output signal, $u_R$ is a second state machine output signal, V is said first input signal and R is said second input signal.

8. The direction sensitive phase detector according to claim 1, characterized in that said state machine is configured with $2^n$ states, and all state transitions occur along the edges of an n-dimensional state cube, where n is an integer equal to or greater than 3.

9. A method of operating a direction sensitive phase detector, said phase detector being based on a state machine that is responsive to a first input signal and a second input signal, comprising releasing a reset state of said state machine only when both said first input signal and said second input signal have a common predetermined signal state, thereby preventing phase inversion during phase detector operation.

10. The method according to claim 9, wherein said state machine is operating according to the following expressions:

$$u_V = V \text{ OR } (u_V \text{ AND } R)$$

$$u_R = R \text{ OR } (u_R \text{ AND } V),$$

where $u_V$ is a first state machine output signal, $u_R$ is a second state machine output signal, V is said first input signal and R is said second input signal.

11. The method according to claim 9, wherein said state machine is operating according to the following expressions:

$$u_V = V \text{ OR } (u_V \text{ AND } R) \text{ OR } (u_V \text{ AND } \overline{u_R})$$

$$u_R = R \text{ OR } (u_R \text{ AND } V) \text{ OR } (u_R \text{ AND } \overline{u_V}),$$

where $u_V$ is a first state machine output signal, $u_R$ is a second state machine output signal, V is said first input signal and R is said second input signal.

* * * * *